(12) United States Patent
Kronenberger

(10) Patent No.: US 11,175,328 B1
(45) Date of Patent: Nov. 16, 2021

(54) TESTING APPARATUS FOR DETECTING INSULATION RESISTANCE OF A HIGH VOLTAGE LINE AND METHOD FOR SAME

(71) Applicant: Bayerische Motoren Werke Aktiengesellschaft, Munich (DE)

(72) Inventor: Thomas Kronenberger, Jetzendorf (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/283,278

(22) PCT Filed: Nov. 6, 2019

(86) PCT No.: PCT/EP2019/080346
§ 371 (c)(1),
(2) Date: Apr. 7, 2021

(87) PCT Pub. No.: WO2020/114701
PCT Pub. Date: Jun. 11, 2020

(30) Foreign Application Priority Data

Dec. 4, 2018 (DE) ...................... 10 2018 130 830.2

(51) Int. Cl.
*G01R 31/00* (2006.01)
*G01R 27/18* (2006.01)
*G01R 31/52* (2020.01)

(52) U.S. Cl.
CPC ............ *G01R 31/006* (2013.01); *G01R 27/18* (2013.01); *G01R 31/52* (2020.01)

(58) Field of Classification Search
CPC ....... G01R 31/006; G01R 31/52; G01R 27/18
See application file for complete search history.

(56) References Cited

U.S. PATENT DOCUMENTS 3,775,682 A 11/1973 Ross
5,302,904 A 4/1994 Nopper
(Continued)

FOREIGN PATENT DOCUMENTS

DE 975 957 12/1962
DE 10 2017 005 306 A1 11/2017
(Continued)

OTHER PUBLICATIONS

International Search Report (PCT/ISA/210) issued in PCT Application No. PCT/EP2019/080346 dated Feb. 12, 2020 with English translation (six (6) pages).
(Continued)

*Primary Examiner* — Dominic E Hawkins
(74) *Attorney, Agent, or Firm* — Crowell & Moring LLP

(57) ABSTRACT

A testing apparatus and a method for detecting insulation resistance of an unshielded high voltage line are provided. The testing apparatus has a voltage source for providing a measurement voltage for the high voltage line, an accommodating device for accommodating the high voltage line and for connecting the high voltage line to the voltage source, an insulation tester for detecting the insulation resistance on the basis of the measurement of a leakage current via the insulating sheath, two electrically conductive half shells which, when combined, form hollow cylindrical sheathing for the high voltage line, and two contact probes which can be electrically connected to the sheathing and to an inner conductor of the high voltage line. The insulation tester is designed to measure a current between the contact probes as the leakage current.

10 Claims, 5 Drawing Sheets

(56) References Cited

U.S. PATENT DOCUMENTS

| | | | |
|---|---|---|---|
| 5,652,521 A | 7/1997 | Meyer | |
| 2002/0196031 A1* | 12/2002 | Blades | G01R 31/11 324/536 |
| 2009/0134881 A1* | 5/2009 | Tachizaki | B60L 3/0023 324/551 |
| 2011/0006781 A1 | 1/2011 | Kawamura | |
| 2011/0181306 A1 | 7/2011 | Nalbant | |
| 2012/0235824 A1 | 9/2012 | Tu et al. | |
| 2015/0123674 A1* | 5/2015 | Piesinger | G01R 31/58 324/539 |
| 2016/0084888 A1 | 3/2016 | Busemann et al. | |
| 2016/0209453 A1 | 7/2016 | Chatroux et al. | |
| 2019/0111786 A1* | 4/2019 | Qian | B60L 53/16 |

FOREIGN PATENT DOCUMENTS

| | | |
|---|---|---|
| EP | 0 539 900 A1 | 5/1993 |
| JP | 6-82501 A | 3/1994 |

OTHER PUBLICATIONS

German-language Written Opinion (PCT/ISA/237) issued in PCT Application No. PCT/EP2019/080346 dated Feb. 12, 2020 (seven (7) pages).

German-language Search Report issued in German Application No. 10 2018 130 830.2 dated Sep. 23, 2019 with partial English translation (12 pages).

German-language Decision to Grant issued in German Application No. 10 2018 130 830.2 dated Oct. 21, 2019 (nine (9) pages).

German language Office Action issued in German Application No. 10 2018 130 830.2 dated Oct. 15, 2019 (six (6) pages).

English translation of German Decision to Grant issued in German Application No. 10 2018 130 380.2 dated Oct. 21, 2019 (three (3) pages).

English translation of German Office Action issued in German Application No. 10 2018 130 830.2 dated Oct. 15, 2019 with English translation (four (4) pages).

* cited by examiner

TESTING APPARATUS FOR DETECTING INSULATION RESISTANCE OF A HIGH VOLTAGE LINE AND METHOD FOR SAME

BACKGROUND AND SUMMARY OF THE INVENTION

The invention relates to a testing apparatus for capturing an insulation resistance of an unshielded high-voltage line which is provided for the purpose of connecting high-voltage components of a motor vehicle and has at least one electrical internal conductor and an insulation jacket surrounding the at least one internal conductor. The invention also relates to a method for capturing an insulation resistance by means of the testing apparatus.

In the present case, the focus is on high-voltage lines which can be used, for example, to electrically connect high-voltage components of electrically drivable motor vehicles. Such high-voltage components may be, for example, a traction battery, power electronics and an electrical drive machine. The high-voltage lines usually have at least one electrical internal conductor, an insulation jacket surrounding the internal conductor and a shield. The shield may comprise, for example, a film and/or braiding made of an electrically conductive material, for example copper. On account of a reduction in the costs and weight of the electrically drivable motor vehicle, it is known practice to form the high-voltage lines in an unshielded manner, that is to say without the shield.

In the case of high-voltage lines, protection measures are required before installation in the motor vehicle in order to meet certain safety requirements and to exclude a risk to persons, for example installation personnel for installing the high-voltage lines and vehicle occupants, as a result of defective high-voltage lines. Such a protection measure is, for example, an insulation measurement in which an insulation resistance of the high-voltage line is captured and functionality of the insulation jacket of the high-voltage line is therefore checked. In this case, a measurement voltage is usually applied to the unit under test, that is to say the high-voltage line. A leakage current flowing via the insulation jacket is then measured over a certain period as a current between the at least one internal conductor and the shield. A profile of the insulation resistance against the measurement voltages can be determined from the leakage current and different measurement voltages and a check can be carried out in order to determine whether this profile corresponds to a reference profile for an intact insulation jacket. However, this measurement method cannot be used in unshielded high-voltage lines on account of the missing shield.

The object of the present invention is to provide a solution as regards how an insulation measurement can also be carried out safely and reliably in unshielded high-voltage lines.

This object is achieved, according to the invention, by means of a testing apparatus and a method having the features according to the respective independent patent claims. The dependent patent claims, the description and the figures relate to advantageous embodiments of the invention.

A testing apparatus according to the invention is used to capture an insulation resistance of an unshielded high-voltage line which is provided for the purpose of connecting high-voltage components of a motor vehicle. The high-voltage line has at least one electrical internal conductor and an insulation jacket surrounding the at least one internal conductor. The testing apparatus has a voltage source for providing a measurement voltage for the high-voltage line, an accommodating device for accommodating the high-voltage line and for connecting the high-voltage line to the voltage source, and an insulation tester for capturing the insulation resistance on the basis of the measurement of a leakage current via the insulation jacket. The testing apparatus also has two electrically conductive half-shells which, in the assembled state, form a sheath in the form of a hollow cylinder for the high-voltage line, and at least two probes which are electrically connected to the insulation tester. In this case, a first probe can be electrically connected to the sheath and a second probe can be electrically connected to the at least one internal conductor. The insulation tester is designed to measure a current between the probes as the leakage current.

The invention also includes a method for testing a high-voltage line by means of a testing apparatus according to the invention. In this case, the high-voltage line is arranged in the accommodating device and is sheathed using the half-shells. The probes are connected to the at least one electrical internal conductor and to the sheath, and the measurement voltage is applied to the high-voltage line by connecting the accommodating device to the voltage source. The current between the probes is then measured, and the insulation resistance is determined from the current between the probes and the measurement voltage provided by the voltage source.

The testing apparatus can be used to check the functionality of the insulation jacket of the high-voltage line before installation in the motor vehicle. In this case, the high-voltage line comprises, in particular, the at least one internal conductor, for example one or more copper conductors, and the insulation jacket which surrounds or sheathes the at least one internal conductor. A shield, for example copper braiding surrounding the insulation jacket, is not provided. The high-voltage line is therefore unshielded and therefore has a reduced weight and reduced costs in comparison with a shielded high-voltage line.

The testing apparatus has the voltage source which is in the form of a constant voltage source and provides a measurement voltage having different voltage values for application to the high-voltage line. The measurement voltage corresponds, in particular, to an operating voltage of the high-voltage line, but is less than a breakdown voltage in order to avoid damage to the insulation jacket. The measurement voltage may have values between 100 V and 250 V, for example. The testing apparatus also has the accommodating device for the high-voltage line. The accommodating device is used, on the one hand, to hold the high-voltage line and, on the other hand, to make electrical contact between the high-voltage line and the voltage source. The accommodating device preferably comprises two adapters which can be electrically connected to the voltage source and a first adapter of which can be electrically connected to a first end of the at least one internal conductor of the high-voltage line and a second adapter of which can be electrically connected to a second end of the at least one internal conductor of the high-voltage line. The high-voltage line can therefore be clamped between the adapters and electrical contact can be made with the high-voltage line by means of the adapters. A distance between the adapters can be adapted to a length of the high-voltage line.

In particular, a controllable switch is provided between the accommodating device and the voltage source, which switch can be used to connect the accommodating device and therefore the high-voltage line to the voltage source and to disconnect them from the voltage source again. A duration of the measurement can be set or predefined via a duration of the closed state of the switch. For example, the switch can be controlled by the insulation tester.

Since the high-voltage line does not have an electrically conductive shield which can constitute a reference potential when measuring the insulation resistance, the testing apparatus has the half-shells which can be used to artificially simulate this shield for the period of the protection measure. The half-shells can be applied to the high-voltage line from above and below, for example, and can enclose the high-voltage line between them. In this case, the half-shells may end in a flush manner, thus resulting in the sheath in the form of a hollow cylinder or the tubular sheath, wherein the half-shells can be fixed in the assembled state using suitable closures, for example. In this case, the half-shells may be separate from one another in the unassembled state. It may also be the case that the half-shells are connected in a hinged manner via a hinge. The half-shells are particularly preferably in the form of copper sheets. For example, the half-shells may be formed by bending the copper sheets. A length of the half-shells and therefore a length of the sheath correspond, in particular, to a length of the high-voltage line.

The sheath is connected to a reference potential, for example the ground potential, with respect to which the at least one internal conductor is tested. If the high-voltage line has a plurality of internal conductors, each internal conductor can be tested with respect to the reference potential. For testing, the voltage source is first of all connected to the high-voltage line, for example by closing the switch, and a potential which differs from the ground potential is therefore applied to the at least one internal conductor. After applying the measurement voltage to the high-voltage line, a leakage current flows between the at least one internal conductor and the sheath on account of the potential difference, which leakage current exceeds a particular threshold value in the event of defective insulation, for example on account of a damaged insulation jacket. This leakage current can be tapped off by means of the probes or measurement tips which are electrically connected to the internal conductor and to the sheath. The insulation tester can calculate the insulation resistance on the basis of the measurement voltage and the measured current and can output the insulation resistance. In particular, the current is captured over a predetermined measurement period and an insulation resistance value is determined after this measurement period, for example after 60 seconds. The measurement is then repeated for different measurement voltage values and an insulation resistance profile against the measurement voltages is output. The insulation is deemed to be intact, for example, when resistance values of the insulation resistance profile are above a predetermined limit.

Using the half-shells also makes it possible to check the insulation resistance of an unshielded high-voltage line in a simple and reliable manner. Costs and weight in the motor vehicle can therefore be saved by using the unshielded high-voltage line and the safety requirements can be simultaneously complied with by means of the testing apparatus.

It proves to be advantageous if a length of the half-shells and therefore a length of the sheath can be adapted to a length of the high-voltage line by virtue of the half-shells having a reversibly variable length, in particular being able to be extended in a telescopic manner. The testing apparatus can be easily adapted to different high-voltage lines by virtue of the variable-length or flexible-length half-shells, and functionality of the insulation jacket can be checked for each high-voltage line over the entire length of the high-voltage line.

In one development of the invention, the testing apparatus has a guide system, by means of which the half-shells are mounted in a slidable manner with respect to the accommodating device and, in order to arrange the half-shells on the high-voltage line, can be pushed together with the formation of the sheath. The guide system is designed, in particular, to hold half-shells of different length and to mount them in a slidable manner with respect to the accommodating device. The guide system is fixed in a stationary manner in the testing apparatus, in particular. The half-shells can be arranged on the guide system. The half-shells can then be pushed together by means of the guide system and can be pushed toward the high-voltage line from two opposite sides, for example from above and below, until they enclose the high-voltage line between them. The testing apparatus is particularly flexible as a result of the guide system.

The guide system preferably has, for each half-shell, at least one guide device with two sliding rods in each case and a connecting web arranged between the sliding rods, wherein the respective half-shell is fastened to the connecting web and the connecting web is mounted in a linearly displaceable manner on the sliding rods via guide elements. In particular, the guide system has two guide devices for each half-shell, wherein first guide devices of the half-shells are fastened to the accommodating device in the region of the first adapter and second guide devices of the half-shells are fastened to the accommodating device in the region of the second adapter. The sliding rods are arranged, for example, in a vertical manner and at a distance from one another in a parallel manner and guide the connecting web between them. The connecting web may be connected to the sliding rods, for example via guide elements in the form of guide rings, with the result that the connecting web can be linearly pushed, for example up and down, along the sliding rods. The half-shells are fastened to the connecting webs, wherein the half-shells can be pushed onto one another by means of the connecting webs in order to close the sheath and can be pushed away from one another in order to open the sheath.

In a further embodiment of the invention, the testing apparatus has at least one filling element which can be arranged on the high-voltage line and, if an external diameter of the high-voltage line is less than an internal diameter of the sheath formed by the half-shells and a cavity is formed between the high-voltage line and the sheath, can be arranged in the cavity in order to fix the high-voltage line in the sheath. In particular, the at least one filling element is in the form of a bending ring formed from an elastic material. The half-shells have, in particular, a predetermined size which predefines the internal diameter of the sheath. In order to now be able to fix a high-voltage line in the sheath without play independently of its external diameter, the testing apparatus has the at least one filling element which can be arranged between the sheath and the high-voltage line and therefore supports the high-voltage line in the sheath. The filling element in the form of the elastic bending ring may be, for example, a slotted rubber ring. For example, a plurality of rubber rings, for example three rubber rings, can be arranged in a manner distributed over the length of the high-voltage line and can be used to support the high-voltage line at three points and to hold it in the sheath.

The embodiments presented with respect to the testing apparatus according to the invention and their advantages accordingly apply to the method according to the invention.

Further features of the invention emerge from the claims, the figures and the description of the figures. The features and combinations of features mentioned above in the description and the features and combinations of features mentioned below in the description of the figures and/or shown only in the figures can be used not only in the respectively stated combination, but also in other combinations or alone.

The invention is now explained in more detail on the basis of a preferred exemplary embodiment and with reference to the drawings.

BRIEF DESCRIPTION OF THE DRAWINGS

In the figures, identical and functionally identical elements are provided with the same reference signs.

DETAILED DESCRIPTION OF THE DRAWINGS

Figure 1:
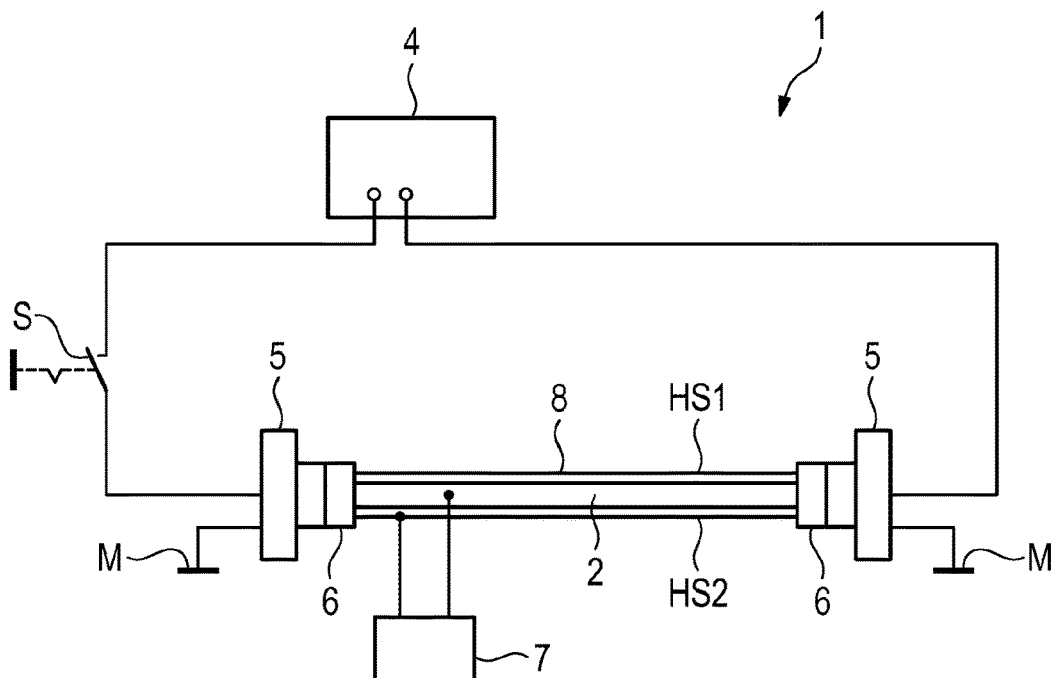
FIG. 1 is a schematic illustration of an embodiment of a testing apparatus according to the invention.
Figure 2:
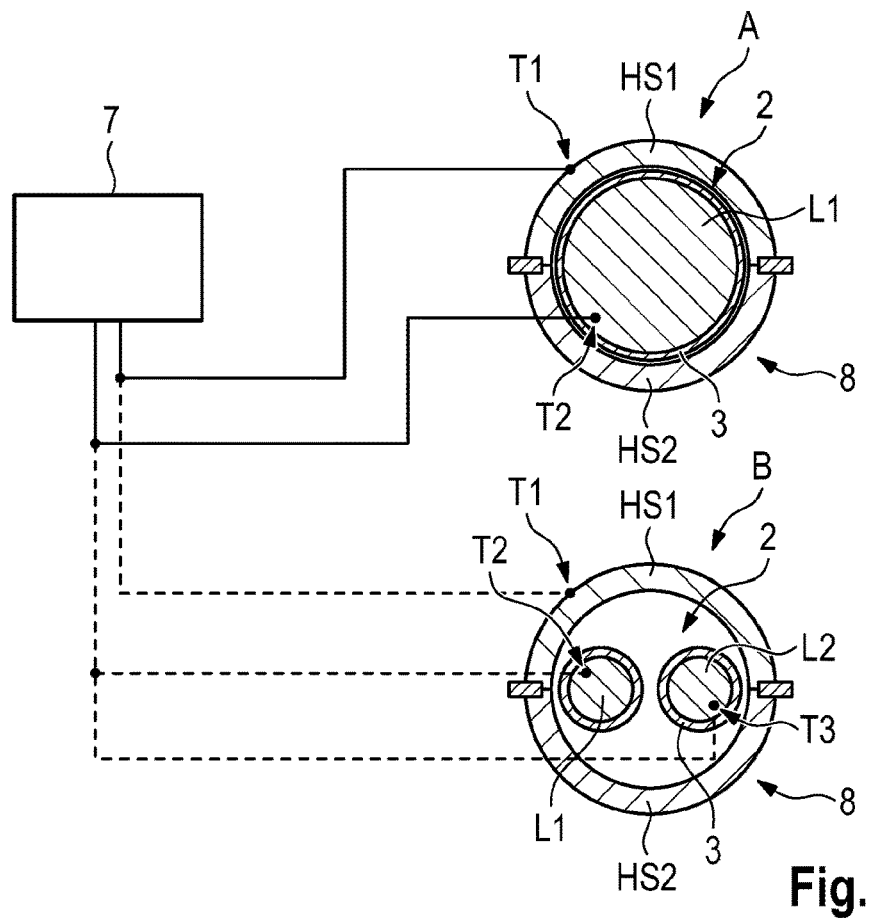
FIG. 2 is a cross-sectional illustration of high-voltage lines which are tested using the testing apparatus.

FIG. 1 shows a testing apparatus 1 for a high-voltage line 2 which is provided for the purpose of electrically connecting high-voltage components of an electrically drivable motor vehicle. As shown on the basis of the cross-sectional illustration in FIG. 2, the high-voltage line 2 is unshielded and has precisely one internal conductor L1 (one-conductor system A in FIG. 2) or a plurality of internal conductors L1, L2 (two-conductor system B in FIG. 2). The internal conductor(s) L1, L2 is/are surrounded by an insulation jacket 3 made of an electrically insulating material. The testing apparatus 1 is designed to check an insulation resistance of the insulation jacket 3. For this purpose, the testing apparatus 1 has a voltage source 4 which is designed to provide a measurement voltage for the high-voltage line 2. The high-voltage line 2 is arranged in an accommodating device 5 of the testing apparatus 1, which accommodating device has two adapters 6 for making electrical contact with the high-voltage line 2. The accommodating device 5 can be connected to the voltage source 4 via a controllable switch S. When the switch S is closed, the measurement voltage provided by the voltage source 4 is applied to the high-voltage line 2. The testing apparatus 1 also has an insulation tester 7 which is designed to measure a leakage current via the insulation jacket 3 and to determine the insulation resistance of the insulation jacket 3 on the basis of the leakage current and the measurement voltage.

Figure 3:
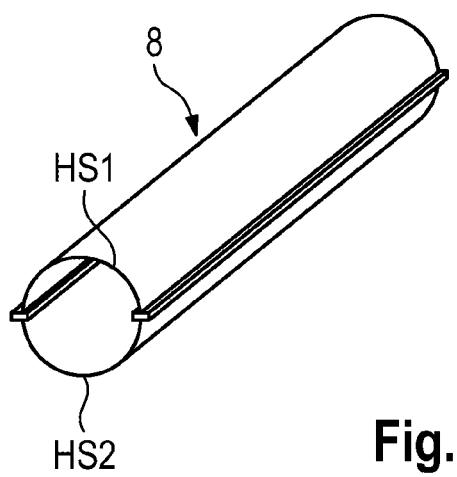
FIG. 3 is a schematic illustration of a sheath for a high-voltage line.

Since the high-voltage line 2 is unshielded and does not have an electrically conductive shield which can be used as a reference potential and with respect to which the internal conductor L1, L2 can be tested, the testing apparatus 1 has two half-shells HS1, HS2 which are formed from an electrically conductive material. For example, the half-shells HS1, HS2 may be in the form of copper sheets. The half-shell HS1 is, for example, in the form of an upper half-shell which is arranged on the high-voltage line 2 from above and can sheath an upper half of the high-voltage line 2 along its length. The half-shell HS2 is, for example, in the form of a lower half-shell which is arranged on the high-voltage line 2 from below and can sheath a lower half of the high-voltage line 2 along its length. In the assembled state, as shown in FIG. 3, the half-shells HS1, HS2 form a sheath 8 in the form of a hollow cylinder or a tubular sheath 8. The missing shield of the high-voltage line 2 can be "simulated" by the sheath 8. The sheath 8 can be connected to a reference potential, for example ground M, via the accommodating device 5, for example.

Figure 4:
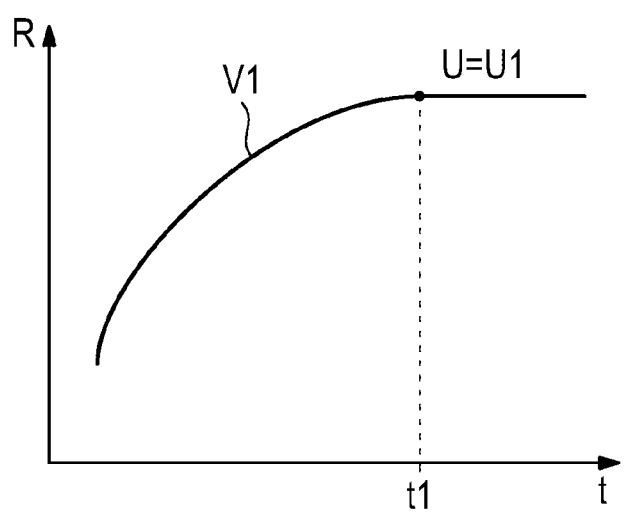
FIG. 4 is an illustration of a profile of the insulation resistance against time.
Figure 5:
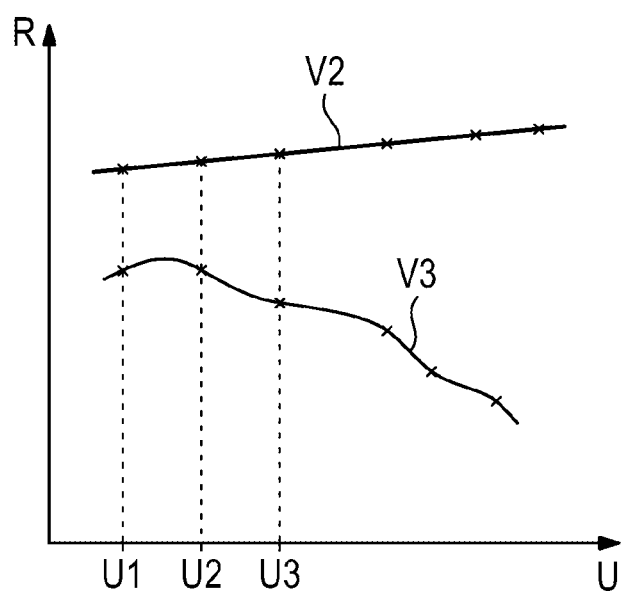
FIG. 5 is an illustration of profiles of the insulation resistance against the measurement voltage.

In order to measure the leakage current, when the switch S is closed, a current flowing between the at least one internal conductor L1, L2 and the sheath 8 is measured. For this purpose, the testing apparatus 1 has at least two probes T1, T2, T3. A first probe T1 is connected to the sheath 8. A second probe T2 is connected to the internal conductor L1. In the case of the two-conductor system B, a third probe T3 is additionally connected to the internal conductor L2. The probes T1, T2, T3 are connected to the insulation tester 7 which measures the current between the probes T1, T2, T3 and therefore between the respective internal conductor L1, L2 and the sheath 8. The insulation tester 7 may output a profile V1 of the insulation resistance R against time t, as shown in the characteristic curve according to FIG. 4. For example, the insulation resistance R can be captured after a particular period t1, for example 60 s, for a particular measurement voltage U=U1, for example 100 V. The measurement is then repeated for further measurement voltages U2, U3, etc. and a profile V2, V3 of the insulation resistance R against the measurement voltage U is determined. The profiles V2, V3 are shown in FIG. 5. The profile V2, in which the insulation resistance R is approximately constant for different measurement voltages U1, U2, U3 and exceeds a predetermined threshold value, characterizes an intact insulation jacket 3. The profile V3, in which the insulation resistance R decreases with increasing measurement voltages U1, U2, U3 and falls below the predetermined threshold value, characterizes a damaged insulation jacket 3.

Figure 6:
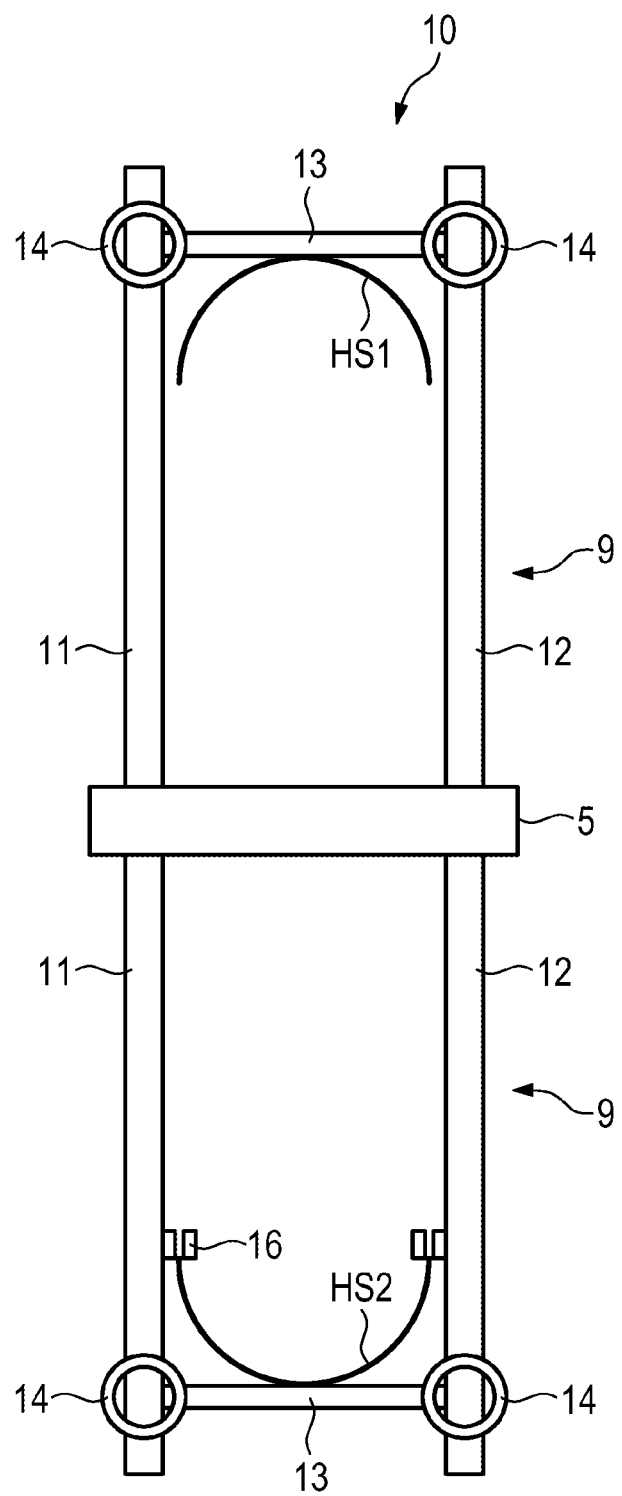
FIG. 6 is a schematic illustration of a guide system of the testing apparatus.

FIG. 6 shows guide devices 9 of a guide system 10 of the testing apparatus 1, by means of which the half-shells HS1, HS2 are held and are mounted in a slidable manner with respect to the accommodating device 5. The guide devices 9 each have two sliding rods 11, 12 which are fastened to the accommodating device 5 in a stationary manner. A connecting web 13, to which the half-shells HS1, HS2 are fastened, is respectively arranged between the two sliding rods 11, 12. The connecting webs 13 are connected to the sliding rods 11, 12 via guide elements 14, for example guide rings, and can therefore be pushed up and down. In order to arrange the half-shells HS1, HS2 on the high-voltage line 2, the connecting web 13, to which the upper half-shell HS1 is fastened, is pushed down and the connecting web 13, to which the lower half-shell HS2 is fastened, is pushed up. The half-shells HS1, HS2 are pushed together as a result and are placed flush against one another. In this case, the high-voltage line 2 is enclosed between the half-shells HS1, HS2. For example, one of the half-shells HS1, HS2, here the lower half-shell HS2, may have a receptacle 16 in which the other half-shell HS1, here the upper half-shell HS1, is accommodated and is held on the lower half-shell HS2 in a stationary manner.

Figure 7:
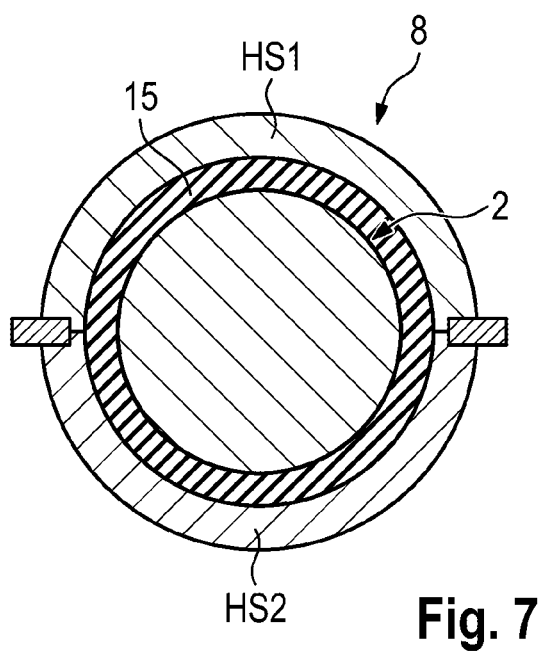
FIG. 7 shows a cross-sectional illustration of a high-voltage line.

If an external diameter D1 of the high-voltage line 2 is less than an internal diameter D2 of the sheath 8, a filling element 15 can be arranged between the high-voltage line 2 and the sheath 8, as shown in FIG. 7, and holds the high-voltage line 2 in the sheath 8. The filling element 15 may be a slotted rubber ring, for example.

LIST OF REFERENCE SIGNS

1 Testing apparatus
2 High-voltage line
3 Insulation jacket
4 Voltage source
5 Accommodating device
6 Adapter
7 Insulation tester
8 Sheath
9 Guide devices
10 Guide system
11, 12 Sliding rods
13 Connecting webs
14 Guide rings
15 Filling element
16 Receptacle
L1, L2 Internal conductor
T1, T2, T3 Probes
HS1, HS2 Half-shells
S Switch
A One-conductor system
B Two-conductor system
U, U1, U2, U3 Measurement voltage
R Insulation resistance
V1, V2, V3 Profiles
t, t1 Time
D1, D2 Diameter
M Ground

What is claimed is:

1. A testing apparatus for capturing an insulation resistance of an unshielded high-voltage line provided for connecting high-voltage components of a motor vehicle and having at least one electrical internal conductor and an insulation jacket surrounding the at least one internal conductor, the testing apparatus comprising:
    a voltage source that provides a measurement voltage for the high-voltage line;
    an accommodating device that accommodates the high-voltage line and connects the high-voltage line to the voltage source;
    an insulation tester that captures the insulation resistance on the basis of a measurement of a leakage current via the insulation jacket;
    two electrically conductive half-shells which, in an assembled state, form a sheath in the form of a hollow cylinder for the high-voltage line; and
    at least two probes which are electrically connected to the insulation tester, wherein
    a first probe is electrically connectable to the sheath and a second probe is electrically connectable to the at least one internal conductor, and
    the insulation tester is designed to measure a current between the first and second probes as the leakage current.

2. The testing apparatus according to claim 1, wherein the half-shells are in the form of copper sheets.

3. The testing apparatus according to claim 1, wherein a length of the half-shells and, therefore, a length of the sheath, is adaptable to a length of the high-voltage line by virtue of the half-shells having a reversibly variable length.

4. The testing apparatus according to claim 3, wherein the half-shells are configured to be extendable in a telescopic manner.

5. The testing apparatus according to claim 1, wherein the accommodating device has two adapters which are electrically connectable to the voltage source, wherein
    a first adapter is electrically connectable to a first end of the high-voltage line, and
    a second adapter is electrically connectable to a second end of the high-voltage line.

6. The testing apparatus according to claim 1, further comprising:
    a guide system by which the half-shells are mounted in a slidable manner with respect to the accommodating device and, in order to arrange the half-shells on the high-voltage line, are pushed together with the formation of the sheath.

7. The testing apparatus according to claim 6, wherein
    the guide system has, for each half-shell, at least one guide with two sliding rods in each case and a connecting web arranged between the two sliding rods,
    a respective half-shell is fastened to the connecting web, and the connecting web is mounted in a linearly displaceable manner on the two sliding rods via guide elements.

8. The testing apparatus according to claim 1, further comprising:
    at least one filling element which is arrangeable on the high-voltage line, wherein
    when an external diameter of the high-voltage line is less than an internal diameter of the sheath formed by the half-shells, whereby a cavity is formed between the high-voltage line and the sheath, the filling element is arranged in the cavity in order to fix the high-voltage line in the sheath.

9. The testing apparatus according to claim 8, wherein the at least one filling element is in the form of a bending ring formed from an elastic material.

10. A method for testing a high-voltage line via a testing apparatus for capturing an insulation resistance of the high-voltage line which is provided for connecting high-voltage components of a motor vehicle and has at least one electrical internal conductor and an insulation jacket surrounding the at least one internal conductor, wherein the testing apparatus comprises:
    a voltage source that provides a measurement voltage for the high-voltage line;
    an accommodating device that accommodates the high-voltage line and connects the high-voltage line to the voltage source;
    an insulation tester that captures the insulation resistance on the basis of a measurement of a leakage current via the insulation jacket;
    two electrically conductive half-shells which, in an assembled state, form a sheath in the form of a hollow cylinder for the high-voltage line; and
    at least two probes which are electrically connected to the insulation tester, wherein
    a first probe is electrically connectable to the sheath and a second probe is electrically connectable to the at least one internal conductor, and
    the insulation tester is designed to measure a current between the first and second probes as the leakage current,
    the method comprising the steps of:
        arranging the high-voltage line in the accommodating device;
        using the half-shells to sheath the high-voltage line;
        connecting the two probes to the at least one electrical internal conductor and to the sheath;

applying the measurement voltage to the high-voltage line by connecting the accommodating device to the voltage source;
measuring the current between the two probes; and
determining the insulation resistance from the current between the two probes and the measurement voltage provided by the voltage source.

* * * * *